United States Patent
Ishida

(10) Patent No.: US 7,432,531 B2
(45) Date of Patent: Oct. 7, 2008

(54) SEMICONDUCTOR DEVICE

(75) Inventor: Hidetoshi Ishida, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 433 days.

(21) Appl. No.: 11/346,266

(22) Filed: Feb. 3, 2006

(65) Prior Publication Data
US 2006/0175618 A1    Aug. 10, 2006

(30) Foreign Application Priority Data
Feb. 7, 2005   (JP)   ............................. 2005-030815

(51) Int. Cl.
*H01L 31/0256* (2006.01)
*H01L 33/00* (2006.01)
(52) U.S. Cl. ............................. 257/76; 257/103; 257/94
(58) Field of Classification Search ............ 257/76–103
See application file for complete search history.

(56) References Cited

U.S. PATENT DOCUMENTS

| 6,639,925 | B2 * | 10/2003 | Niwa et al. | 257/76 |
| 7,132,691 | B1 * | 11/2006 | Tanabe et al. | 257/79 |
| 2005/0039673 | A1 | 2/2005 | Ishida | |
| 2005/0279994 | A1 | 12/2005 | Ueda et al. | |
| 2005/0280022 | A1 | 12/2005 | Ueda et al. | |
| 2006/0076585 | A1 | 4/2006 | Kato et al. | |

FOREIGN PATENT DOCUMENTS

| JP | 2001-160656 | 6/2001 |
| JP | 2002-076329 | 3/2002 |

OTHER PUBLICATIONS

Ambacher et al., "*Two-dimensional electron gases induced by spontaneous and piezoelectric polarization charges in N- and Ga-face AlGaN/GaN heterostructures*," Journal of Applied Physics, vol. 85, No. 6, pp. 3222-3233 (Mar. 15, 1999).
English Language Abstract of JP 2001-160656.
English Language Abstract of JP 2002-076329.

* cited by examiner

*Primary Examiner*—Cuong Q Nguyen
(74) *Attorney, Agent, or Firm*—Greenblum & Bernstein, P.L.C.

(57) ABSTRACT

A semiconductor device, which can accurately control carrier density, includes: a single crystal substrate; a semiconductor layer which is made of hexagonal crystal with 6 mm symmetry and is formed on the single crystal substrate; a source electrode, a drain electrode and a gate electrode which are formed on the semiconductor layer, where the main surfaces of a GaN layer and an AlGaN layer constituting the semiconductor layer respectively include C-axis of the hexagonal crystal, and a length direction of a channel region in the semiconductor layer is parallel to the C-axis of the hexagonal crystal.

19 Claims, 8 Drawing Sheets

SEMICONDUCTOR DEVICE

BACKGROUND OF THE INVENTION (1) Field of the Invention

The present invention relates to a nitride electronic device intended for power switching as represented by an inverter used for an electric vehicle and a home electric appliance, and also relates to a nitride optical device as represented by a blue/white light-emitting diode (LED) and a laser device.

(2) Description of the Related Art

Recently, a nitride semiconductor has been under intense research and development as a material for high-output power devices or blue light-emitting devices, to the extent that an optical device using a nitride semiconductor, in particular, has already been introduced into the market.

A Modulation Doped Field-effect Transistor (MODFET) applying an aluminum gallium nitride (AlGaN)/gallium nitride (GaN) heterojunction is studied as an electronic device. The most significant difference between such MODFET and a gallium arsenide (GaAs) MODFET is that the former MODFET can realize a sheet carrier density ten times as much as that of the GaAs MODFET without doping, with impurities, an AlGaN layer which is a Schottky layer. The mechanism of carrier generation is that two-dimensional electrons are accumulated in a boundary between AlGaN and GaN, which is caused by a polarization generated due to a piezo effect in the AlGaN layer because of the stress between AlGaN and GaN due to the lattice mismatch, as well as a voluntary polarization in AlGaN. Therefore, stress is a very important parameter for the MODFET applying the AlGaN/GaN heterojunction, and thus, a relationship between sheet carrier density and the stress between AlGaN and GaN is vigorously researched. For example, sheet carrier density of two-dimensional electron gas is quantitatively calculated based on stress, as described in pp. 3222-3233, Vol. 85, Journal of Applied Physics (1999) written by O. Ambacher et al.

As is represented by the example shown in the above-mentioned reference, the conventional AlGaN/GaN heterojunction is formed by stacking layers in a direction of C-axis. This is because, with such formation of heterojunction, namely, with the formation of an AlGaN/GaN heterojunction on C-plane, the effect of polarization unique to nitride-based compound semiconductor can be obtained.

In contrast, Japanese Laid-Open Application No. 2002-76329 discloses a structure in which AlGaN/GaN heterojunction is formed on A-plane of a sapphire substrate and a gate direction is paralleled to a direction of C-axis of the sapphire substrate. Thus, it is possible to make effective use of low conductivity in the C-axis direction of the sapphire substrate, and thereby to achieve high-speed operation in an electronic device. Such case also allows the AlGaN/GaN heterojunction, being a device region, to be formed by stacking layers in the C-axis direction due to an epitaxial relationship between the sapphire substrate and a GaN layer, although the main surface of the sapphire substrate on which the AlGaN/GaN heterojunction is to be formed is the A-plane. That is to say that the use of the AlGaN/GaN heterojunction on the C-plane is the same as described in the cited reference, Journal of Applied Physics. In addition, the Japanese Laid-Open Application No. 2002-76329 does not explicitly mention a relationship between a gate direction of an electronic device and a crystal direction of nitride semiconductor material.

Japanese Laid-Open Application No. 2001-160656 discloses a field-effect transistor (FET) in which A-plane or M-plane of a material containing crystal which has a wurtzite structure is used as a main surface of a substrate, and a length direction of a gate electrode is placed vertical to C-axis so that a direction of current is made parallel to the C-axis. With such FET, a dispersion of carriers due to dislocation is reduced so that the FET with excellent electric characteristics can be realized.

SUMMARY OF THE INVENTION

Although the conventional AlGaN/GaN heterojunction on C-plane can realize a high sheet carrier density due to the polarization effect, it is difficult to effectively dope a semiconductor with impurities. In other words, an amount of carriers generated by the polarization overwhelmingly increases so that it is difficult to give an accurate carrier profile through doping. Therefore, with the MODFET applying the AlGaN/GaN heterojunction on C-plane, for instance, it is possible, on one hand, to heighten breakdown voltage and saturation threshold current by material characteristic of nitride semiconductor. On the other hand, the problem is that it is difficult to control pinch-off voltage.

The Japanese Laid-Open Application No. 2001-160656 discloses the FET using a heterojunction on A-plane or M-plane. However, in the case where a nitride semiconductor layer whose main surface is the A-plane or the M-plane is formed, and a length direction of a gate electrode is placed vertical to C-axis, a channel region below the gate electrode receives stress in a direction vertical to the C-axis. This results, as shown in FIG. 1, in the generation, in the nitride semiconductor layer, of a large amount of charge that is greater than $1 \times 10^{17}$ cm$^{-3}$ (the amount of charge greater than the values in the higher half of $10^{16}$ cm$^{-3}$) indicating a residual carrier density of undoped GaN), to the extent that the characteristics of the device are affected. Consequently, it is difficult to give an accurate carrier profile through doping.

The present invention is conceived in view of the above problem, and an object of the present invention is to provide a semiconductor device that can accurately control carrier density.

The inventors of the present invention are the first persons who have demonstrated, based on accurate calculations, the generation of piezo-charge in a semiconductor device which is made of a nitride semiconductor material and includes a semiconductor layer whose main surface is a surface that includes C-axis not C-plane, which is discussed in the present invention. The demonstration has eventually led the inventors to the present invention.

In order to achieve the above object, the semiconductor device according to the present invention comprises: a first semiconductor layer which includes an active region and is made of a first hexagonal crystal with 6 mm symmetry; and a second semiconductor layer which is formed on a main surface of the first semiconductor layer and is made of a second hexagonal crystal with 6 mm symmetry having a band gap energy different from a band gap energy of the first hexagonal crystal, wherein the main surface of said first semiconductor layer is parallel to a C-axis of the first hexagonal crystal; wherein a main surface of said second semiconductor layer is parallel to a C-axis of the second hexagonal crystal; and wherein a length direction of the active region is parallel to the C-axis of the second hexagonal crystal.

With such structure, the main surface of the semiconductor layer includes, unlike the conventional case, C-axis not C-plane, which solves the problem of polarization specific to the C-plane. Also, piezo-charge of extremely high density is no longer generated in the material formed on the main surface of the semiconductor layer, which leads to the realization of the semiconductor device which can accurately control carrier density. That is to say that a precise carrier profile can be provided owing to impurity doping, and thus can realize the semiconductor device that can enhance the characteristic of the device.

Since the active region does not receive stress in the direction vertical to the C-axis, it is also possible to suppress the local generation of piezo-charge caused by such stress to the active region. As a result, it is possible to realize the semiconductor device which can accurately control carrier density.

In addition, piezo-charge density in the active region can be extremely reduced so that it is possible to achieve the semiconductor device capable of controlling carrier density more accurately.

The semiconductor device may be a semiconductor laser device, and the active region may be a ridge.

The structure as described above prevents the holes injected from an electrode from re-combining with over-flowed n-type carriers in the materials formed on the main surface of the semiconductor layer and the ridge. It is therefore possible to realize the semiconductor laser device with low voltage threshold and low current threshold.

The semiconductor device may be a field-effect transistor, and the active region may be a channel region.

With the above structure, it is possible to realize a normally-off FET.

The main surface of the first semiconductor layer may be tilted 0.1 to 10 degrees from an A-plane of the first hexagonal crystal.

Such structural feature improves crystallinity of the semiconductor layer and allows an elastic constant matrix and a piezoelectric constant matrix to get close to the value originally indicated by a material, so that it is possible to thoroughly reduce the generation of piezo-charge. In other words, it is possible to realize the semiconductor device that can control the carrier density more accurately.

The main surface of the first semiconductor layer may be tilted 0.1 to 10 degrees from an M-plane of the first hexagonal crystal.

The above-mentioned structural feature improves crystallinity of the semiconductor layer and allows an elastic constant matrix and a piezoelectric constant matrix to get close to the value originally indicated by a material, so that it is possible to thoroughly reduce the generation of piezo-charge. Namely, it is possible to realize the semiconductor device that can control the carrier density more accurately.

The first semiconductor layer and the second semiconductor layer may be made of In(x)Al(y)Ga(z)N (1-x-y-z), where x, y and z are between 0 and 1 inclusive, a sum of x, y and z equals to 1, and x, y and z do not indicate 0 at the same time.

With such feature, piezoelectric property of crystal can be apparent in a notable manner.

The semiconductor device may further include a sapphire substrate, wherein the first semiconductor layer is formed on an R-plane of the sapphire substrate.

With the structure as described above, it is possible to allow the semiconductor layer, which is made of hexagonal crystal (6 mm) and has the A-plane as the main surface, to grow while maintaining its high quality.

The semiconductor device may further include an α-SiC substrate, wherein said first semiconductor layer is formed on a (11-20) plane of said α-SiC substrate.

With the structure as described above, it is possible to allow the semiconductor layer, which is made of hexagonal crystal (6 mm) and has the A-plane as the main surface, to grow while maintaining its high quality. In addition, it is possible to render heat radiation characteristic to be at a satisfactory level.

The semiconductor device may further include a GaN substrate, wherein the first semiconductor layer is formed on a (11-20) plane of the GaN substrate.

With the structure as described above, it is possible to allow the semiconductor layer, which is made of hexagonal crystal (6 mm) and has the A-plane as the main surface, to grow while maintaining its high quality.

The semiconductor device of the present invention may include: a first semiconductor layer which includes an active region and is made of a first hexagonal crystal with 6 mm symmetry; and a second semiconductor layer which is formed on a main surface of the first semiconductor layer and is made of a second hexagonal crystal with 6 mm symmetry having a band gap energy different from a band gap energy of the first hexagonal crystal, wherein the main surface of the first semiconductor layer is parallel to a C-axis of the first hexagonal crystal; wherein a main surface of the second semiconductor layer is parallel to a C-axis of the second hexagonal crystal; and wherein the active region receives stress of $10^8$ (dyn/cm$^2$) or less in a direction vertical to the C-axis. The length direction of the active region may be vertical to the C-axis of the second hexagonal crystal.

With such structure, the main surface of the semiconductor layer does not include C-plane but C-axis, unlike the conventional case, which solves the problem of polarization unique to the C-plane. Also, piezo-charge with extremely high density is not generated in the material formed on the main surface of the semiconductor layer. Thus, it is possible to realize the semiconductor device which can accurately control carrier density. In other words, an accurate carrier profile can be given through doping of impurities, which realizes the semiconductor device capable of enhancing the characteristics of the device.

Since the active region does not receive stress in the direction vertical to the C-axis, it is also possible to suppress the local generation of piezo-charge caused by such stress to the active region. As a result, it is possible to realize the semiconductor device which can accurately control carrier density.

In addition, piezo-charge density in the active region can be extremely reduced so that it is possible to achieve the semiconductor device capable of controlling carrier density more accurately.

The length direction of the active region may be parallel to the C-axis of the second hexagonal crystal.

With the structural feature as described above, it is possible to surely suppress the local generation of piezo-charge caused by the stress to the active region. As a result, it is possible to realize the semiconductor device capable of controlling carrier density more accurately.

As has been described above, with the semiconductor device according to the present invention, it is possible to realize the semiconductor device which can accurately control carrier density without being affected by piezo-charge of extremely high density. Thus, it is possible to give an accurate carrier profile through doping of impurities, and thus can achieve the semiconductor device capable of enhancing the characteristics of the device. Also, it is possible to realize the semiconductor device which allows flexibility in design.

As is obvious from the above description, the present invention can provide a FET and a semiconductor laser device which can accurately control carrier density, and can realize the FET with high-speed and the semiconductor laser device with low voltage threshold and low current threshold. Therefore, practical values of the invention are extremely high.

For further information about technical background to this application, the disclosure of Japanese Patent Application No. 2005-030815 filed on Feb. 7, 2005, including specification, drawings and claims is incorporated herein by reference in its entirety.

BRIEF DESCRIPTION OF THE DRAWINGS

These and other objects, advantages and features of the invention will become apparent from the following description thereof taken in junction with the accompanying drawings that illustrate a specific embodiment of the invention. In the Drawings.

DESCRIPTION OF THE PREFERRED EMBODIMENT(S)

The following describes the semiconductor device according to the embodiment of the present invention, with reference to the diagrams.

First Embodiment

Figure 2A:
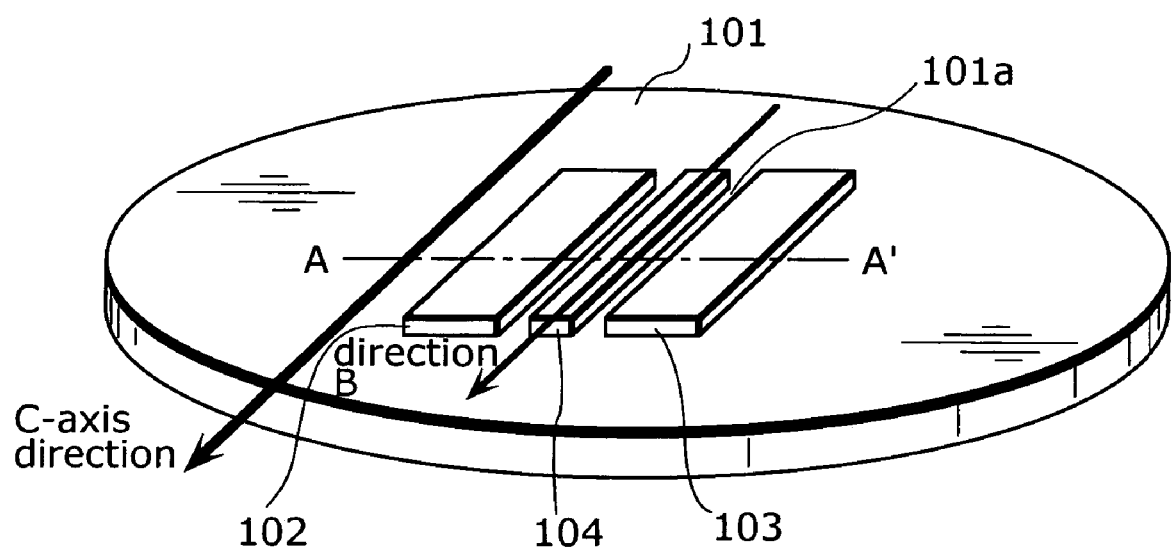
FIG. 2A is a diagonal view showing a structure of a Field-Effect Transistor (FET) according to a first embodiment of the present invention.
Figure 2B:
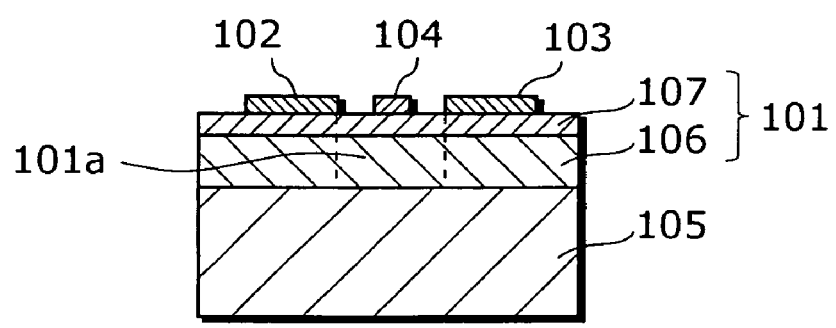
FIG. 2B is a cross-sectional view (sectioned at a line A-A' shown in FIG. 2A) showing the structure of the FET according to the first embodiment.

FIG. 2A is a diagonal view showing a Field-effect Transistor (FET) according to the first embodiment. FIG. 2B is a cross-sectional view of the FET at the A-A' line shown in FIG. 2A. Note that FIG. 2A is a pattern diagram showing a part in which one FET is formed upon a wafer.

The FET according to the embodiment includes: a single crystal substrate 105; a semiconductor layer 101 which is made of hexagonal crystal with 6 mm symmetry, being $In(x)Al(y)Ga(z)N$ $(1-x-y-z)$ where $0 \leq x, y, z \leq 1$, and $x+y+z=1$, and x, y and z are not simultaneously 0, and is formed on the main surface of the single crystal substrate 105 by epitaxial method; a source electrode 102; a drain electrode 103; and a gate electrode 104 which are formed on the main surface of the semiconductor layer 101.

The single crystal substrate 105 may be, for example, a sapphire substrate having R-plane as the main surface, or a silicon carbide (SiC) substrate having (11-20) plane as the main surface, or a GaN substrate having the (11-20) plane as the main surface.

The semiconductor layer 101 includes a channel region 101a as an active region below the gate electrode 104, and is made up of a GaN layer 106 and an AlGaN layer 107. Here, the main surface of the GaN layer 106 on which the AlGaN layer 107 is formed and the main surface of the AlGaN layer 107 on which the gate electrode 104 is formed are, for instance, A-plane or M-plane respectively, and are made parallel to C-axis. Namely, the C-axis is included within the respective planes. Thus, the number of carriers generated due to polarization in AlGaN/GaN heterojunction becomes less, so that sheet carrier density in the AlGaN/GaN heterojunction can be reduced. In other words, a GaN material originally has a voluntary polarization in the direction of the C-axis, and a large polarization due to piezo effect is generated as the GaN material is expanded or strained in the direction of the C-axis. Therefore, a large amount of carriers are accumulated in the material on the C-plane. It is, however, possible to prevent it with the structure in which a GaN material includes, within a plane thereof, C-axis. It should be noted that plane-directions of the GaN layer 106 and the AlGaN layer 107 are set, for example, by changing a plane-direction of the single crystal substrate 105.

Here, a length direction of the channel region 101a (direction B in FIG. 2A) which is parallel to a length direction of the gate electrode 104 is made parallel to the C-axis direction of the GaN layer 106 and the AlGaN layer 107, so that piezo-charge hardly generates in the channel region 101a. This attributes to a generation of stress in the direction vertical to the length direction of the gate electrode 104, caused by the formation of the gate electrode 104 on the surface of the semiconductor layer 101. In other words, in the case where the semiconductor layer 101 is made of hexagonal crystal with 6 mm symmetry, and the direction of the stress added to the channel region 101a, namely, the direction of stressing is vertical to the C-axis direction of the GaN layer 106 and the AlGaN layer 107, the generation of piezo-charge can be suppressed.

The following describes in detail why the amount of generated piezo-charge differs depending on the direction of stress with respect to the C-axis direction.

In general, the amount of generated piezo-charge can be derived based on the stress added to crystal and elastic constant matrix and piezoelectric constant matrix of substance. Therefore, the amount of piezo-charge generated in a hexagonal crystal shall be determined based on such elastic constant matrix and piezoelectric constant matrix. The elastic constant matrix and the piezoelectric constant matrix of a hexagonal crystal with 6 mm symmetry, in particular, can be respectively expressed as (1) and (2) below.

Elastic constant matrix (1)

$$[c] = \begin{pmatrix} c11 & c12 & c13 & 0 & 0 & 0 \\ c12 & c11 & c13 & 0 & 0 & 0 \\ c13 & c12 & c33 & 0 & 0 & 0 \\ 0 & 0 & 0 & c44 & 0 & 0 \\ 0 & 0 & 0 & 0 & c44 & 0 \\ 0 & 0 & 0 & 0 & 0 & (c11-c12)/2 \end{pmatrix}$$

-continued

Piezoelectric constant matrix (2)

$$[e] = \begin{pmatrix} 0 & 0 & 0 & 0 & e15 & 0 \\ 0 & 0 & 0 & e15 & 0 & 0 \\ e31 & e31 & e33 & 0 & 0 & 0 \end{pmatrix}$$

Figure 3:
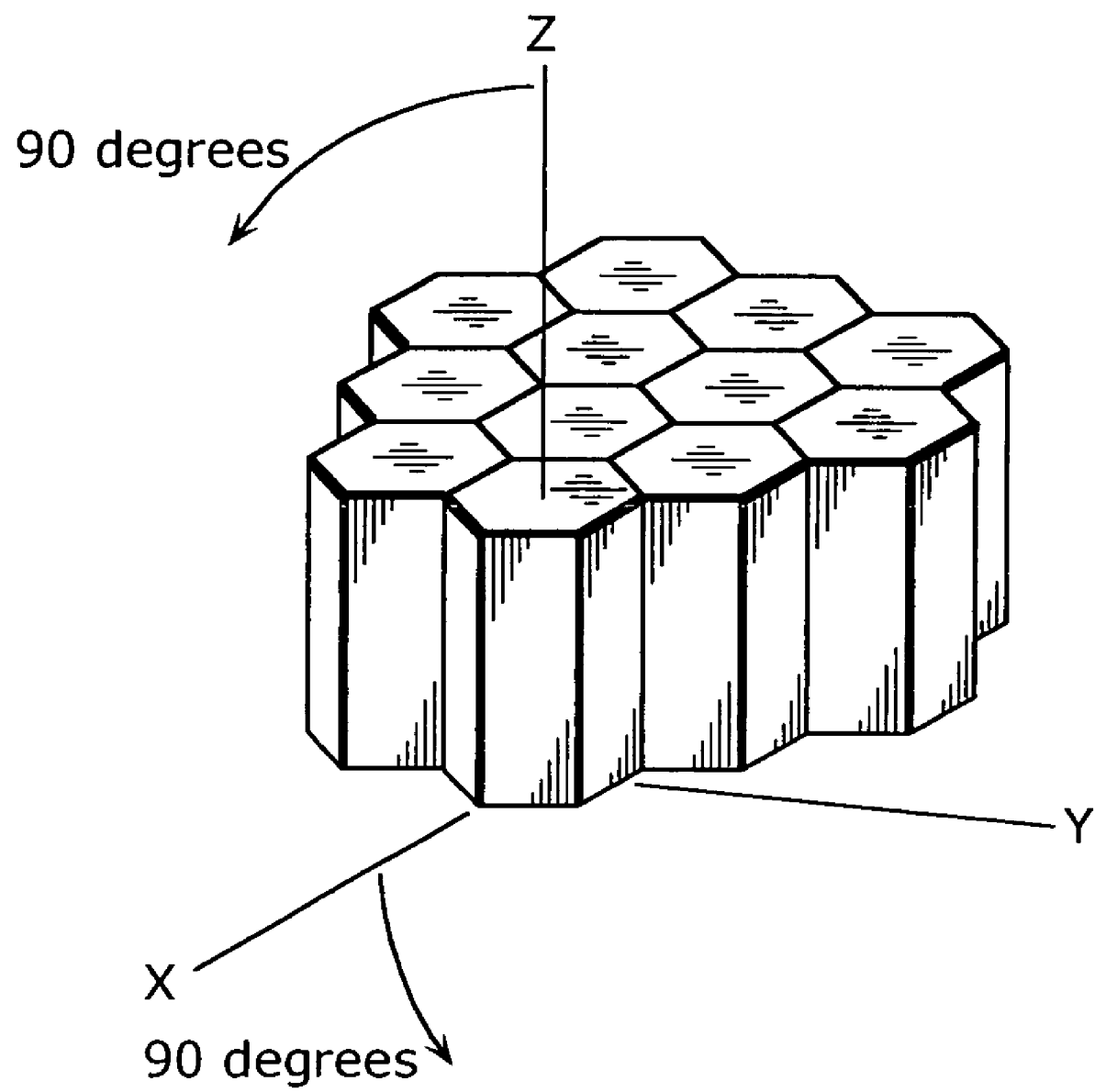
FIG. 3 is a diagram for describing a coordinate transform method of a material constant.

Note that these constants are constants derived in the case where a hexagonal crystal is placed in an orthogonal coordinate system as shown in FIG. 3. In the case where coordinate transform is performed so as to rotate such constants with respect to a Z-axis, using transform matrices [a] and [M], the expressions (1) and (2) respectively become, due to the symmetry, the expressions (3) and (4) as indicated below.

$$[C'] = [M][C][M]^T = [C] \quad (3)$$

$$[e'] = [a][e][M]^T = [e] \quad (4)$$

Here, $$[a] = \begin{pmatrix} \cos\theta & \sin\theta & 0 \\ -\sin\theta & \cos\theta & 0 \\ 0 & 0 & 1 \end{pmatrix} \quad (5)$$

$$[M] = \begin{pmatrix} \cos^2\theta & \sin^2\theta & 0 & 0 & 0 & \sin 2\theta \\ \sin^2\theta & \cos^2\theta & 0 & 0 & 0 & -\sin 2\theta \\ 0 & 0 & 1 & 0 & 0 & 0 \\ 0 & 0 & 0 & \cos\theta & -\sin\theta & 0 \\ 0 & 0 & 0 & \sin\theta & \cos\theta & 0 \\ -\sin 2\theta/2 & \sin 2\theta/2 & 0 & 0 & 0 & \cos 2\theta \end{pmatrix} \quad (6)$$

In other words, in the coordinate transform based on the Z-axis, elastic constant matrix and piezoelectric constant matrix for an arbitrary angle of rotation is as same as the respective matrices indicated before the rotation. The result of the calculation shows that the elastic constant matrix and the piezoelectric constant matrix for which coordinate transform is performed based on an arbitrary axis included within an x-y plane become the same as the respective matrices before the rotation is performed. In this case, the elastic constant matrix and the piezoelectric constant matrix of the hexagonal crystal which is rotated by 90 degrees around the Y-axis becomes the matrix of A-plane and M-plane. Based on what is described so far, the elastic constant matrix and the piezoelectric constant matrix of the A-plane are as same as the respective matrices of the M-plane. In other words, in the case where a plane includes the C-axis therein, the elastic constant matrix and the piezoelectric constant matrix are the same.

The amount of piezo-charge, which is generated in an active region in the case where stress is added to the active region, is calculated based on a finite element method using a matrix of A-plane or M-plane.

Figure 4A:
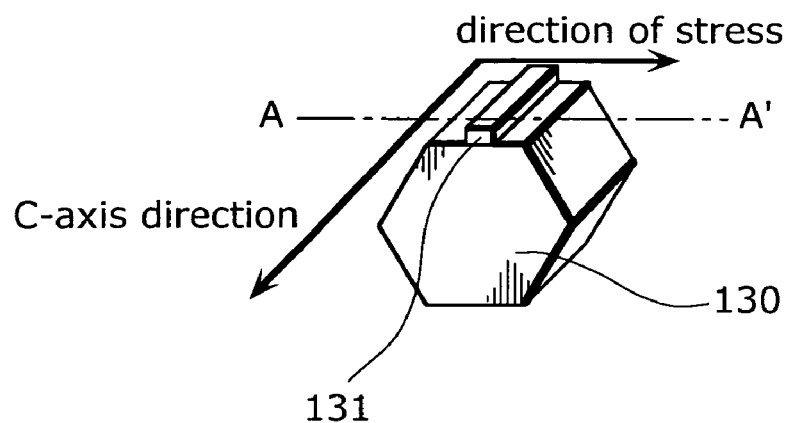
FIG. 4A is a magnified diagonal view of the FET (near an active region)
Figure 4B:
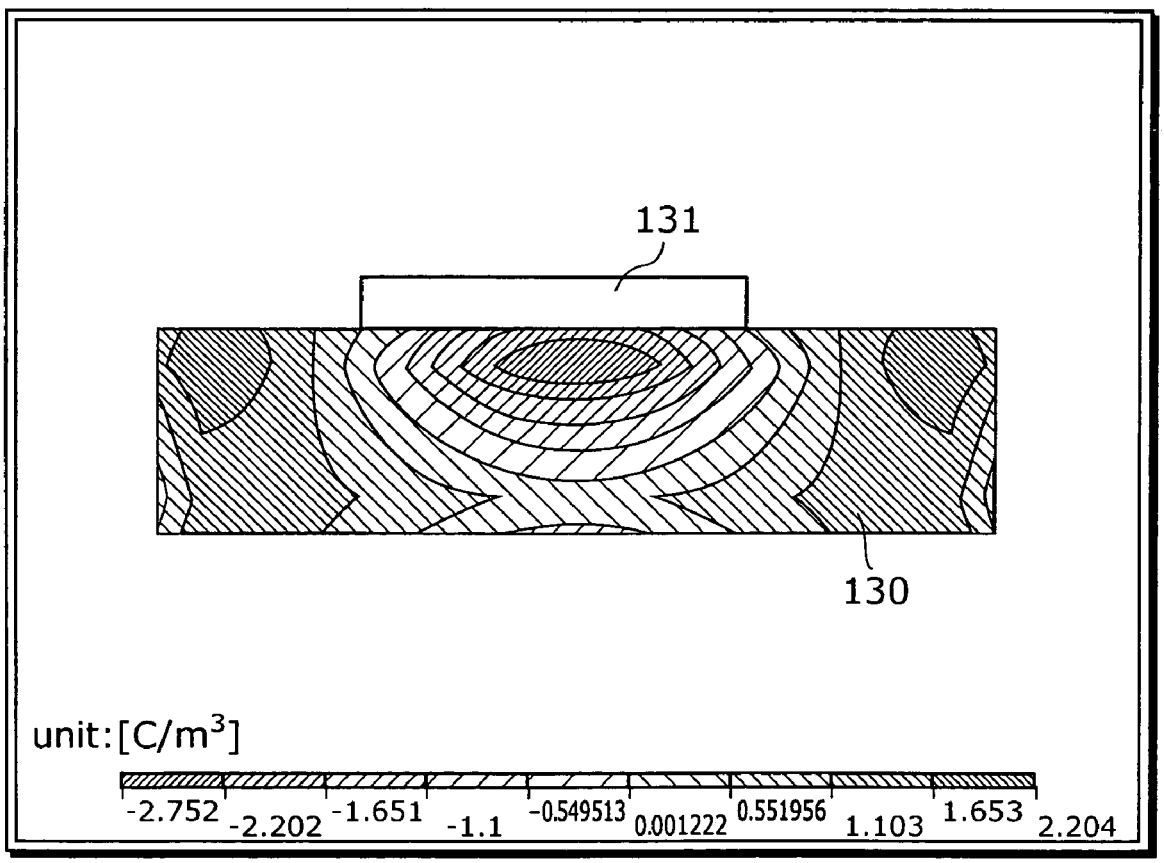
FIG. 4B is a diagram showing a result of calculation of piezo-charge density at a line A-A' shown in FIG. 4A.
Figure 5A:
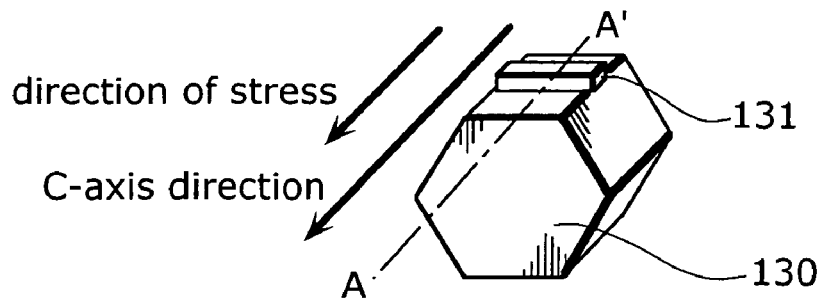
FIG. 5A is a magnified diagonal view of the FET (near an active region)
Figure 5B:
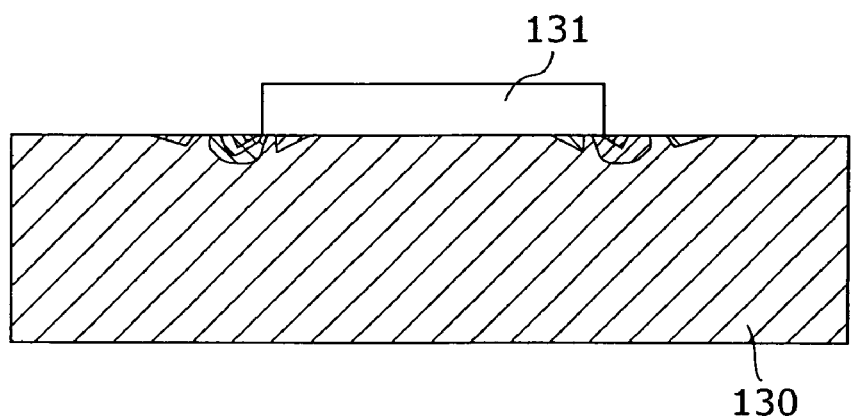
FIG. 5B is a diagram showing a result of calculation of piezo-charge density at a line A-A' shown in FIG. 5A.

FIG. 4A and FIG. 5A are magnified diagonal views of the FET (near an active region). FIG. 4B is a diagram showing the result of the calculation of piezo-charge density at the line A-A' in FIG. 4A, while FIG. 5B is a diagram showing the calculation of the piezo-charge density at the line A-A' in FIG. 5A. Note that FIG. 4B is a diagram showing the result of the calculation of piezo-charge density in the case where the length direction of the active region is parallel to the C-axis direction in the active region. FIG. 5B is a diagram showing the result of the calculation of piezo-charge density in the case where the length direction of the active region is vertical to the C-axis direction in the active region.

In the case where the direction of the stress added to the active region 130 due to the formation of the gate electrode 131 is orthogonal to the C-axis direction, as shown in FIGS. 4A and 4B, the amount of piezo-charge generated is very small as nearing almost zero. In the case where the length direction of the active region is parallel to the C-axis direction in the active region, the influence caused by piezo-charge becomes less. In the case where the direction of the stress added to the active region 130 due to the formation of the gate electrode 131 is parallel to the C-axis direction in the active region 130, as shown in FIGS. 5A and 5B, positive and negative piezo-charge is locally generated in the active region located below the lateral part of the gate electrode 131. That is to say, apparently, in the case where the length direction of the active region is orthogonal to the C-axis direction of the active region, piezo-charge is locally generated.

As described above, the FET of the present embodiment uses the AlGaN/GaN heterojunction made of hexagonal crystal with 6 mm symmetry, and the GaN layer 106 and the AlGaN layer 107 which form the AlGaN/GaN heterojunction include, within the respective plane, the C-axis thereof. Therefore, sheet carrier of high density cannot be accumulated in the hetero boundary, as in the case of the FET using the conventional AlGaN/GaN heterojunction. It is thus possible to realize the FET which can accurately control carrier density. Namely, it is possible to achieve a normally-off FET which can accurately control pinch-off voltage. With the use of the AlGaN/GaN heterojunction for the FET, it is possible to realize the FET with super-high breakdown voltage having high saturation current due to characteristics of the material used for the heterojunction.

According to the FET as described in the embodiment, the semiconductor layer 101 is made of hexagonal crystal with 6 mm symmetry, and the length direction of the channel region 101a in the semiconductor layer 101 is parallel to the C-axis direction of the hexagonal crystal. Therefore, the generation of piezo-charge in the channel region due to the formation of the gate electrode 104 can be suppressed, and thus, it is possible to realize the FET that can control carrier density more accurately.

It should be noted that the AlGaN layer 107 or the GaN layer 106 may have a structure in which the main surface is tilted 0.1 to 10 degrees from the A-plane or M-plane. Thus, crystal of high quality can be obtained at the time of crystal growth in the formation of the AlGaN layer 107 and the GaN layer 106, so that the effects obtained by the suppression of piezo-charge can be further heightened.

It is explained that the length direction of the channel region 101a in the semiconductor layer 101 is parallel to the C-axis direction of the GaN layer 106 and the AlGaN layer 107. However, in the case where the amount of the stress added to the channel region 101a is $10^8$ (dyn/cm$^2$) or less, it is possible to suppress the local generation of piezo-charge. The length direction of the channel region 101a may be therefore vertical to the C-axis direction of the GaN layer 106 and the AlGaN layer 107.

Second Embodiment

Figure 6A:
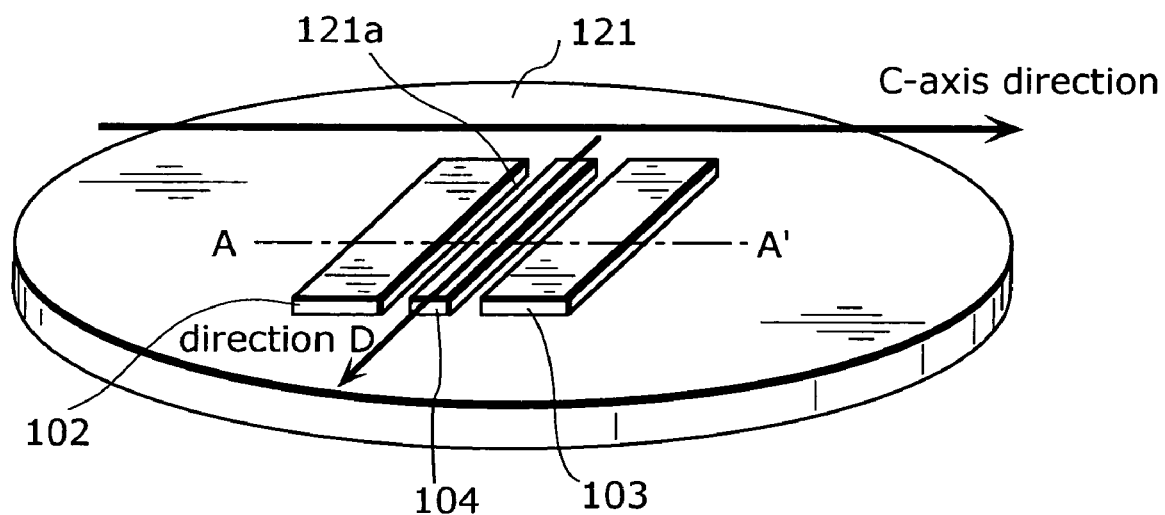
FIG. 6A is a diagonal view showing a structure of the FET according to a second embodiment of the present invention.
Figure 6B:
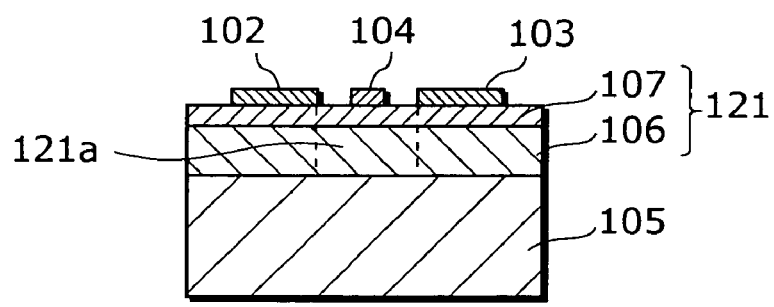
FIG. 6B is a cross-sectional view (sectioned at a line A-A' shown in FIG. 6A) showing the structure of the FET according to the second embodiment.

FIG. 6A is a diagonal view showing the FET according to the second embodiment, whereas FIG. 6B is a cross-sectional view of the FET at the line A-A' in FIG. 6A. Note that FIG. 6A is a pattern diagram showing a part in which one FET is formed on a wafer. The same referential numbers are put for the same components as shown in FIG. 2, so that detailed description thereof is not repeated here.

The FET of the present embodiment differs from the FET according to the first embodiment in that the former has an active region whose length direction is vertical to the C-axis direction of hexagonal crystal, and is made up of a single crystal substrate 105 and a semiconductor layer 121 which is made of hexagonal crystal of 6 mm symmetry and is formed on the main surface of the single crystal substrate 105 based on an epitaxial growth method, a source electrode 102, as well as a drain electrode 103 and a gate electrode 104 which are formed on the main surface of the semiconductor layer 121.

The semiconductor layer 121 has a channel region 121a which serves as an active region below the gate electrode 104, and is comprised of the GaN layer 106 and the AlGaN layer 107. Here, the main surface of the GaN layer 106 on which the AlGaN layer 107 is formed and the main surface of the AlGaN layer 107 on which the gate electrode 104 and others are formed include, within the respective plane, C-axis of the GaN layer 106 and the AlGaN layer 107. Thus, the amount of carriers generated due to polarization in AlGaN/GaN heterojunction becomes less, so that sheet carrier density in the AlGaN/GaN heterojunction can be reduced as well. Note that plane-directions of the GaN layer 106 and the AlGaN layer 107 can be set by changing a plane-direction of, for instance, the single crystal substrate 105.

Figure 1:
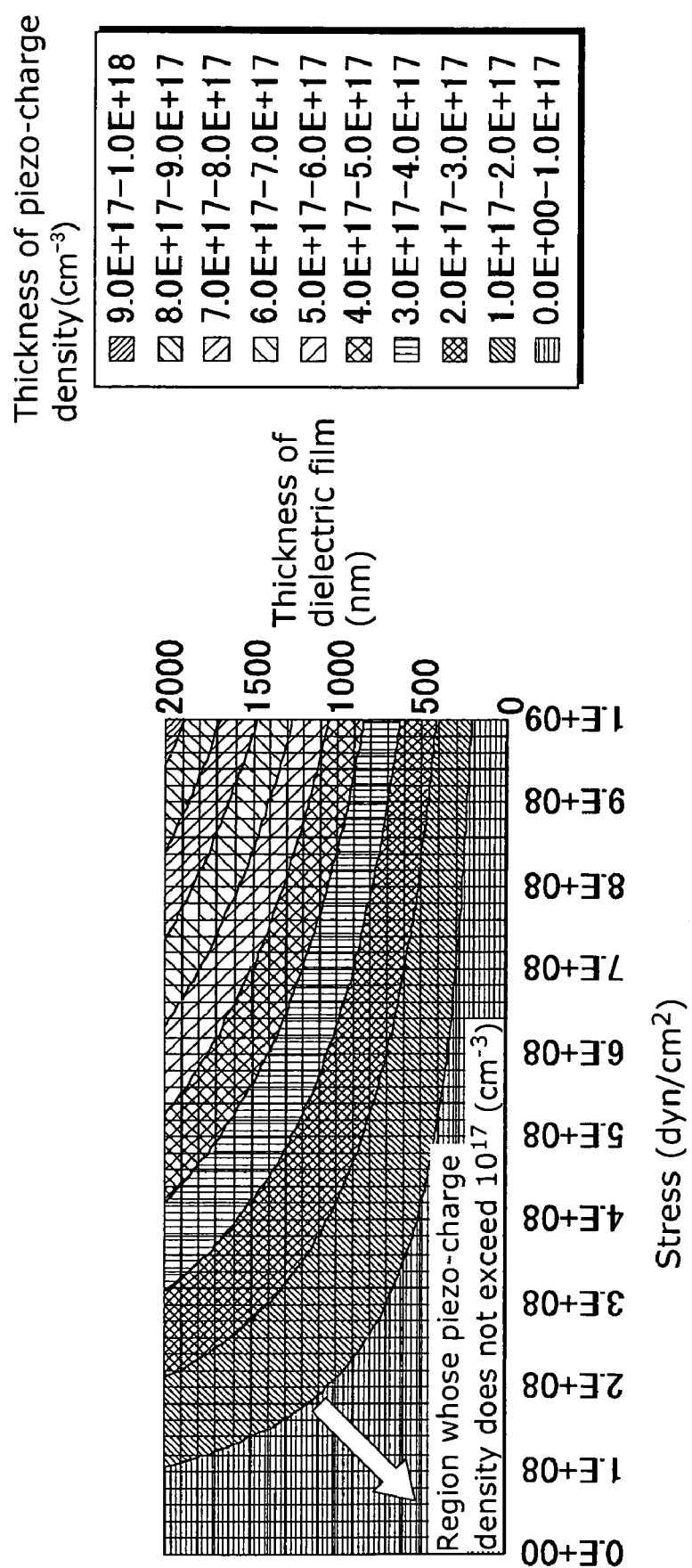
FIG. 1 shows stress dependency of piezo-charge generated in a nitride semiconductor layer.

In the case where the length direction of the channel region 121a (direction D in FIG. 6A) is vertical to the C-axis direction of the GaN layer 106 and the AlGaN layer 107, and the amount of the stress added to the channel region 121a is $10^8$ (dyn/cm$^2$) or greater, the respective positive and negative piezo-charge is locally generated in the channel region 121a located below the lateral part of the gate electrode 104. This attributes to the generation of the stress in the direction vertical to the length direction of the gate electrode 104. In other words, in the case where the direction of the stress added to the channel region 121a is parallel to the C-axis direction of the GaN layer 106 and the AlGaN layer 107, piezo-charge is generated locally. Therefore, the amount of the stress added to the channel region 121a is set to be $10^8$ (dyn/cm$^2$) or less. The charge density of $10^{17}$ cm$^{-3}$ or less does not affect the device characteristic because the residual carrier density of the undoped GaN is $10^{16}$ cm$^{-3}$ order. It then follows, as shown in FIG. 1, that the stress of $10^8$ (dyn/cm$^2$) or less is a stress that reduces thickness dependency of stress. That is to say, it is a stress which generates, with the thickness of 2000 nm or less (a thickness of a dielectric film formed on the nitride semiconductor layer so as to cover the gate electrode), piezo-charge as less as the amount which does not affect the device characteristic of $10^{17}$ cm$^{-3}$. The direction of the electric field (piezo field) generated due to the locally-generated piezo-charge corresponds to the direction directing from the drain electrode 103 toward the source electrode 102.

As described above, according to the FET of the present embodiment, it is possible to realize the FET that can accurately control carrier density for the same reason as described in the first embodiment. That is to say, it is possible to realize a normally-off FET that can accurately control pinch-off voltage. It is also possible to realize the FET with super high breakdown voltage having high saturation current.

According to the FET of the present embodiment, the semiconductor layer 121 is made of hexagonal crystal with 6 mm symmetry, the length direction of the channel region 121a within the semiconductor layer 121 is vertical to the C-axis direction of the hexagonal crystal, and the amount of the stress added to the channel region 121a is $10^8$ (dyn/cm$^2$) or less. Therefore, the local generation of piezo-charge can be suppressed in the channel region 121a near the gate electrode 104, so that it is possible to realize the FET capable of more accurate control over carrier density. That is to say that it is possible to realize a normally-off FET which can more accurately control pinch-off voltage.

Note that the AlGaN layer 107 or the GaN layer 106 may have the structure in which the main surface is tilted 0.1 to 10 degrees from the A-plane or M-plane. Thus, crystal of high quality can be gained at the time of crystal growth in the formation of the AlGaN layer and the GaN layer so that the effects obtained by the suppression of piezo-charge can be further heightened.

Third Embodiment

Figure 7:
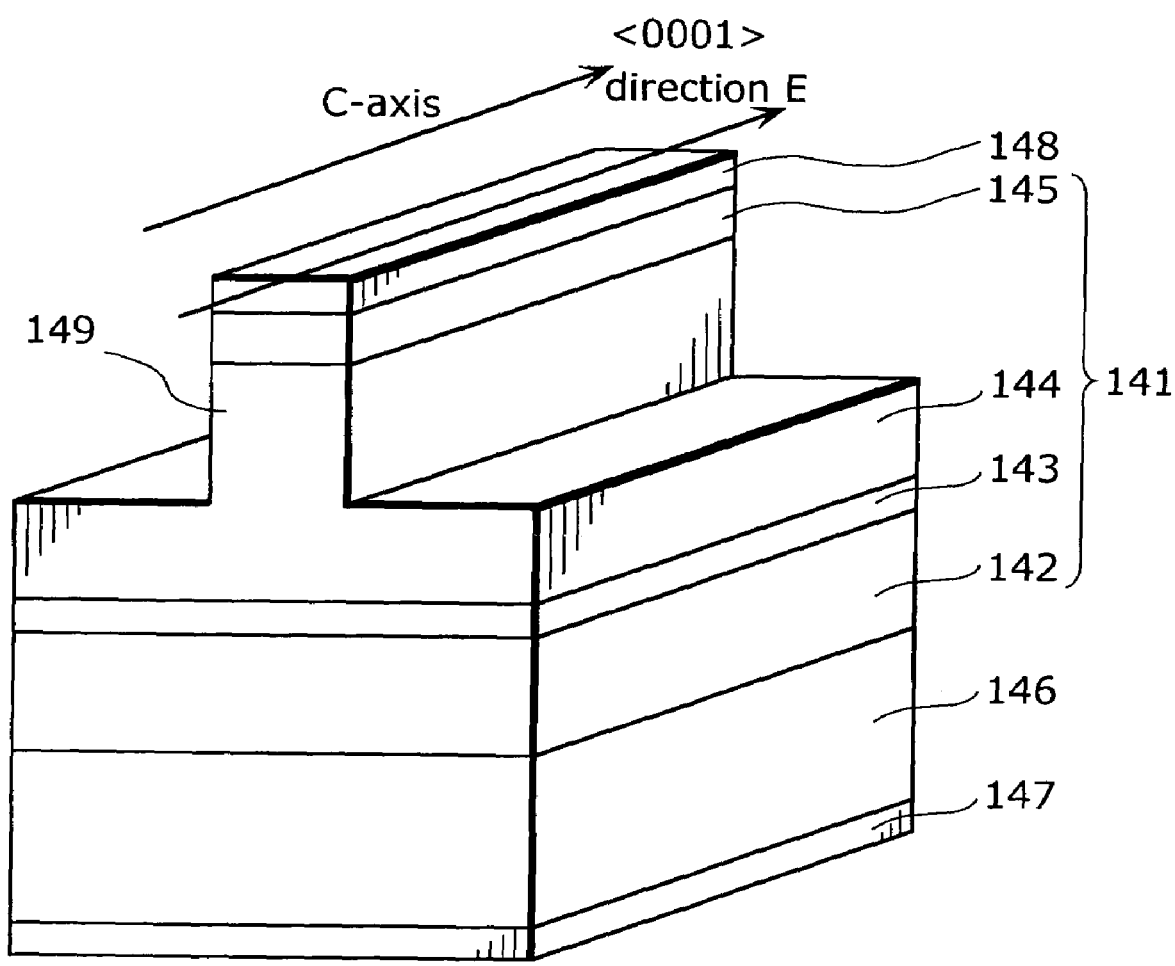
FIG. 7 is a diagonal view showing a structure of a semiconductor laser device according to a third embodiment of the present invention.

FIG. 7 is a diagonal view showing a structure of the semiconductor laser device according to the third embodiment.

The semiconductor laser device according to the present embodiment includes: an n-type GaN substrate 146 having (11-20) plane as the main surface; a semiconductor layer 141 which is made of In(x)Al(y)Ga(z)N (1-x-y-z), where $0 \leq x, y, z \leq 1$, and x+y+z=1, and x, y and z do not indicate 0 at the same time of hexagonal crystal with 6 mm symmetry, and which is formed on the main surface of the n-type GaN substrate 146 based on epitaxial growth method; an n-type electrode 147 which is formed on the rear surface of the n-type GaN substrate 146 and is made of, for instance, Ti, Au and the like; and a p-type electrode 148 which is formed on the main surface of the semiconductor layer 141 and has a multi-layered structure made of, for example, Ni, Pt and Au. Note that the size of one semiconductor laser device within the surface of the substrate is 500 μm×300 μm (500 μm in ridge direction).

The semiconductor layer 141 is formed by sequentially stacking the following: an n-type cladding layer 142 which is formed on the main surface of the n-type GaN substrate 146 and is made of Si-doped Al$_{0.107}$Ga$_{0.93}$N (thickness is 1 μm); an active layer 143 having a multiple quantum well structure; a p-type cladding layer 144 made of Mg-doped Al$_{0.07}$Ga$_{0.93}$N (thickness is 0.5 μm); and a p-type contact layer 145 made of Mg-doped GaN (thickness is 50 nm). Such semiconductor layer 141 has a ridge stripe structure (stripe width is 1.5 μm) in which a striped-ridge 149 is formed as an active region formed as a result of removing a part of the p-type contact layer 145 and the p-type cladding layer 144. The thickness of the p-type cladding layer 144 forming the ridge 149 is 200 nm, and a dielectric film made of SiO$_2$ with the thickness of 200 nm is formed on the lateral surface of the ridge 149 and the surface of the P-type cladding layer 144, although not shown in the diagram. The main surface of the n-type cladding layer 142 on which the active layer 143 is formed, the main surface of the active layer 143 on which the p-type cladding layer 144 is formed, the main surface of the p-type cladding layer 144 on which the p-type contact layer 145 is formed and the main surface of the p-type contact layer 145 on which the p-type electrode 148 is formed respectively include, within the plane, C-axis of hexagonal crystal. Thus, the amount of carriers generated due to polarization in AlGaN/GaN heterojunction becomes less, so that sheet carrier density in the AlGaN/GaN heterojunction can be reduced. Note that respective plane-directions of the n-type cladding layer 142, the active layer 143, the p-type cladding layer 144 and the p-type contact layer 145 are set, for example, by changing a plane direction of the n-type GaN substrate 146. Chart 1 indicated below shows a concrete composition of the n-type GaN substrate 146, the n-type cladding layer 142, the active layer 143, the p-type cladding layer 144 and the p-type contact layer 145.

CHART 1

| | Al | In | Thickness | Dopant | Carrier density ($cm^{-3}$) | Other |
|---|---|---|---|---|---|---|
| n-type GaN substrate 146 | 0 | 0 | 300 um | | | |
| n-type cladding layer 142 | 0.1 | 0 | 1.0 um | Si | $5 \times 10^{18}$ | |
| active layer 143 | | | | | | |
| blocking layer | 0 | 0 | 7 nm | undoped | | multi-quantum well made up of four blocking layers and three well layers |
| well layer | 0 | 0.1 | 3 nm | undoped | | |
| p-type cladding layer 144 | 0.1 | 0 | 0.5 um | Mg | $1 \times 10^{18}$ | |
| p-type contact layer 145 | 0 | 0 | 0.05 um | Mg | $1 \times 10^{18}$ | |

The ridge 149 has the length of 500 μm and the width of 1.5 μm, and a stripe direction of the ridge 149, namely, a length direction of the ridge 149 (direction E in FIG. 7) is parallel to the C-axis direction (<0001>) of the p-type cladding layer 144 and the p-type contact layer 145, so that piezo-charge is hardly generated in the ridge 149. This attributes to the generation of the stress in the direction vertical to the length direction of the ridge 149, caused by the formation of the p-type electrode 148 on the main surface of the semiconductor layer 141. In other words, the generation of piezo-charge is suppressed in the case where the semiconductor layer 141 is made of hexagonal crystal with 6 mm symmetry and the direction of the stress added to the ridge 149 is vertical to the C-axis direction of the p-type cladding layer 144 and the p-type contact layer 145.

The following describes an electric characteristic of a semiconductor laser device (hereinafter to be referred to as "sample A") having the structure as described above. The oscillation wavelength of the laser device is 405 nm.

Figure 8:
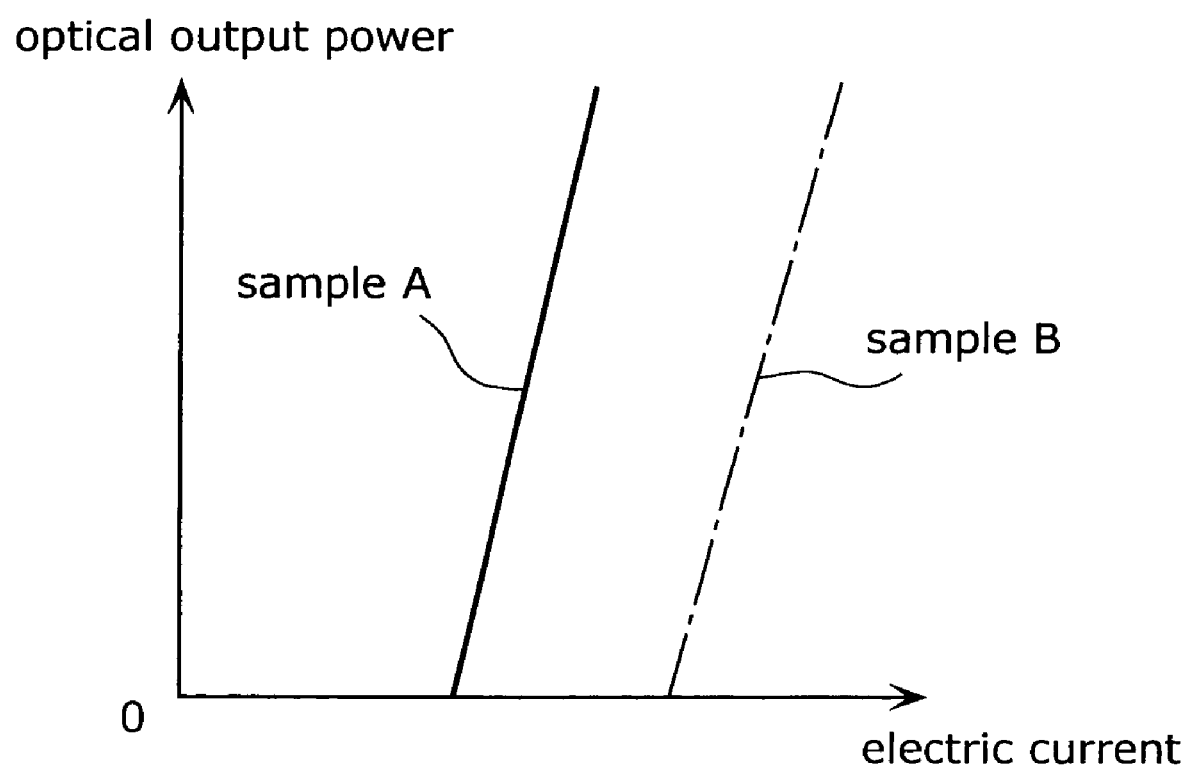
FIG. 8 is a diagram showing current-voltage characteristics (I-V characteristics) of the semiconductor laser device.

FIG. 8 is a diagram showing current-voltage characteristics (I-V characteristics). It should be noted that the diagram also shows, for comparison, the I-V characteristics of the conventional semiconductor laser device (having the same layer structure and stripe width as the sample A, and herein after to be referred to as "sample B") on which a semiconductor layer having a ridge whose length direction is not parallel to the C-axis direction of the p-type cladding layer and the p-type contact layer, is formed on C-plane ((0001) plane) of an n-type GaN substrate.

The result presented in FIG. 8 shows that a voltage threshold and a current threshold of the sample A are smaller than the respective thresholds of the sample B. The reason is as follows. For the sample A, the main surface of the layers which compose the AlGaN/GaN heterojunction includes C-axis within the plane so that neither sheet carrier of extremely high density is accumulated on the hetero boundary nor holes injected from the p-type electrode recombine with the unnecessary n-type carriers in the hetero boundary any longer. At the same time, for the sample A, the length direction of the ridge is parallel to the C-axis direction of the p-type cladding layer and the p-type contact layer so that unnecessary n-type carriers caused due to stress is not generated in the ridge, which does no longer cause the recombination, in the ridge, between the holes injected from the p-type electrode and the unnecessary n-type carriers. As for the sample B, on the other hand, the C-plane is the main surface of the layers composing the AlGaN/GaN heterojunction and the length direction of the ridge is not parallel to the C-axis direction of the p-type cladding layer and the p-type contact layer. Therefore, sheet carrier of extremely high density is accumulated in the hetero boundary, unnecessary n-type carriers is generated in the ridge due to stress, and the holes injected from the p-type electrode recombine with the unnecessary n-type carriers both in the hetero boundary and the ridge. Thus, the voltage threshold and the current threshold of the sample A becomes smaller than the respective thresholds of the sample B as the recombination with the unnecessary n-type carriers is eliminated in the case of sample A.

As has been described above, the semiconductor laser device according to the present embodiment uses the AlGaN/GaN heterojunction made of hexagonal crystal with 6 mm symmetry, and the main surface of the layers composing the AlGaN/GaN heterojunction includes the C-axis within the plane. Thus, the sheet carriers of high density are not accumulated in the hetero boundary, unlike the conventional case, so that it is possible to realize the semiconductor laser device which can accurately control carrier density. Namely, it is possible to realize the semiconductor laser device with low voltage threshold and low current threshold.

According to the semiconductor laser device of the present embodiment, the semiconductor layer 141 is made of hexagonal crystal with 6 mm symmetry, and the length direction of the ridge 149 is parallel to the C-axis of the hexagonal crystal. Thus, the generation of piezo-charge due to stress in the ridge 149 can be suppressed so that it is possible to realize the semiconductor laser device which can control carrier density more accurately.

It should be noted that the n-type cladding layer 142, the active layer 143, the p-type cladding layer 144 and the p-type contact layer 145 may respectively have a structure in which the main surface is tilted 0.1 to 10 degrees from A-plane or M-plane. Thus, crystal of high quality can be gained at the time of crystal growth in the formation of the semiconductor layer so that it is possible to further heighten the effects obtained by the suppression of the piezo-charge.

The n-type GaN substrate 146 is taken as an example of the single crystal substrate on which the semiconductor layer 141 is formed, the present invention is not limited to this case. For example, a sapphire substrate whose main surface is R-plane or a SiC substrate whose main surface is (11-20) plane can be used instead.

The semiconductor device according to the present invention is described based on the embodiments as described above; however, the present invention is not limited to such embodiments. Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

In the above embodiments, a field-effect transistor is used as an example of the semiconductor device, however; the present invention is not limited to such transistor. The same advantages can be gained by a Schottky barrier diode, a bipolar transistor or an optical device as represented by an LED or a laser. Note that in the case where a bipolar transistor is used as the semiconductor device, an active region serves as a base.

INDUSTRIAL APPLICABILITY

The present invention can be used as a semiconductor device, and in particular, as a nitride transistor intended for power switching as represented by an inverter used for an electric vehicle or a home electric appliance, and even as a nitride light emitting device as represented by a blue/white LED and a laser.

What is claimed is:

1. A semiconductor device comprising:
   a first semiconductor layer which includes an active region and is made of a first hexagonal crystal with 6 mm symmetry; and
   a second semiconductor layer which is formed on a main surface of said first semiconductor layer and is made of a second hexagonal crystal with 6 mm symmetry having a band gap energy different from a band gap energy of the first hexagonal crystal,
   wherein the main surface of said first semiconductor layer is parallel to a C-axis of the first hexagonal crystal;
   wherein a main surface of said second semiconductor layer is parallel to a C-axis of the second hexagonal crystal; and
   wherein a length direction of said active region is parallel to the C-axis of the second hexagonal crystal.

2. The semiconductor device according to claim 1, wherein:
   said semiconductor device is a semiconductor laser device; and
   said active region is a ridge.

3. The semiconductor device according to claim 1, wherein:
   said semiconductor device is a field-effect transistor; and
   said active region is a channel region.

4. The semiconductor device according to claim 1,
   wherein the main surface of said first semiconductor layer is tilted 0.1 to 10 degrees from an A-plane of the first hexagonal crystal.

5. The semiconductor device according to claim 1,
   wherein the main surface of said first semiconductor layer is tilted 0.1 to 10 degrees from an M-plane of the first hexagonal crystal.

6. The semiconductor device according to claim 1,
   wherein said first semiconductor layer and said second semiconductor layer are made of In(x)Al(y)Ga(z)N (1-x-y-z), where x, y and z are between 0 and 1 inclusive, a sum of x, y and z equals to 1, and x, y and z do not indicate 0 at the same time.

7. The semiconductor device according to claim 1, further comprising
   a sapphire substrate,
   wherein said first semiconductor layer is formed on an R-plane of said sapphire substrate.

8. The semiconductor device according to claim 1, further comprising
   an α-SiC substrate,
   wherein said first semiconductor layer is formed on a (11-20) plane of said α-SiC substrate.

9. The semiconductor device according to claim 1, further comprising
   a GaN substrate,
   wherein said first semiconductor layer is formed on a (11-20) plane of said GaN substrate.

10. A semiconductor device comprising:
    a first semiconductor layer which includes an active region and is made of a first hexagonal crystal with 6 mm symmetry; and
    a second semiconductor layer which is formed on a main surface of said first semiconductor layer and is made of a second hexagonal crystal with 6 mm symmetry having a band gap energy different from a band gap energy of the first hexagonal crystal,
    wherein the main surface of said first semiconductor layer is parallel to a C-axis of the first hexagonal crystal;
    wherein a main surface of said second semiconductor layer is parallel to a C-axis of the second hexagonal crystal; and
    wherein said active region receives stress of $10^8$ (dyn/cm$^2$) or less in a direction vertical to the C-axis.

11. The semiconductor device according to claim 10,
    wherein a length direction of said active region is parallel to the C-axis of the second hexagonal crystal.

12. The semiconductor device according to claim 10,
    wherein a length direction of said active region is vertical to the C-axis of the second hexagonal crystal.

13. The semiconductor device according to claim 10, wherein:
    said semiconductor device is a field-effect transistor; and
    said active region is a channel region.

14. The semiconductor device according to claim 10,
    wherein the main surface of said first semiconductor layer is tilted 0.1 to 10 degrees from an A-plane of the first hexagonal crystal.

15. The semiconductor device according to claim 10,
    wherein the main surface of said first semiconductor layer is tilted 0.1 to 10 degrees from an M-plane of the first hexagonal crystal.

16. The semiconductor device according to claim 10,
    wherein said first semiconductor layer and said second first semiconductor layer are made of In(x)Al(y)Ga(z)N (1-x-y-z), where x, y and z are between 0 and 1 inclusive, a sum of x, y and z equals to 1, and x, y and z do not indicate 0 at the same time.

17. The semiconductor device according to claim 10, further comprising
    a sapphire substrate,
    wherein said first semiconductor layer is formed on an R-plane of said sapphire substrate.

18. The semiconductor device according to claim 10, further comprising
    an α-SiC substrate,
    wherein said first semiconductor layer is formed on a (11-20) plane of said α-SiC substrate.

19. The semiconductor device according to claim 10, further comprising
    a GaN substrate,
    wherein said first semiconductor layer is formed on a (11-20) plane of said GaN substrate.

* * * * *